United States Patent
Wade (10) Patent No.: US 9,910,095 B2
(45) Date of Patent: Mar. 6, 2018

(54) VOLTAGE MEASUREMENT FOR MULTIPLE CELL BATTERY PACK

(71) Applicant: John Manford Wade, Ramona, CA (US)

(72) Inventor: John Manford Wade, Ramona, CA (US)

( * ) Notice: Subject to any disclaimer, the term of this patent is extended or adjusted under 35 U.S.C. 154(b) by 176 days.

(21) Appl. No.: 14/968,862

(22) Filed: Dec. 14, 2015

(65) Prior Publication Data

US 2016/0097815 A1   Apr. 7, 2016

Related U.S. Application Data

(63) Continuation-in-part of application No. 14/099,956, filed on Dec. 8, 2013, now Pat. No. 9,213,066.

(51) Int. Cl.
| | |
|---|---|
| G01R 31/36 | (2006.01) |
| H02J 7/00 | (2006.01) |
| G01D 9/00 | (2006.01) |
| G01R 19/00 | (2006.01) |

(52) U.S. Cl.
CPC ............ *G01R 31/362* (2013.01); *G01D 9/00* (2013.01); *H02J 7/0018* (2013.01); *H02J 7/0021* (2013.01); *H02J 7/0029* (2013.01); *H02J 7/0093* (2013.01); *G01R 19/0084* (2013.01); *H02J 2007/004* (2013.01); *H02J 2007/0037* (2013.01)

(58) Field of Classification Search
CPC .................................................. G01R 31/362
USPC ........................................................ 324/426
See application file for complete search history.

(56) References Cited

U.S. PATENT DOCUMENTS

| | | | | |
|---|---|---|---|---|
| 4,865,044 | A * | 9/1989 | Wallace | A61B 5/0008 128/903 |
| 5,047,915 | A * | 9/1991 | Smith | H02M 5/271 361/77 |
| 5,287,243 | A * | 2/1994 | Hu | H01H 47/325 361/152 |
| 5,372,141 | A * | 12/1994 | Gallup | A61B 5/0002 600/547 |
| 5,708,269 | A * | 1/1998 | Meissner | G01J 5/22 250/332 |
| 8,085,185 | B2 * | 12/2011 | Stewart | G01S 7/032 342/159 |
| 2005/0269963 | A1* | 12/2005 | Komatsu | H05B 41/2886 315/209 R |
| 2010/0102884 | A1* | 4/2010 | Takaso | H03F 3/45085 330/252 |
| 2010/0164579 | A1* | 7/2010 | Acatrinei | H02M 1/4208 327/172 |
| 2011/0089908 | A1* | 4/2011 | Sunderlin | H02J 7/0016 320/163 |

* cited by examiner

*Primary Examiner* — M'baye Diao
(74) *Attorney, Agent, or Firm* — Yichuan Pan (57) ABSTRACT

A method and apparatus to detect cell voltage of each of a plurality of battery cells in a rechargeable battery pack is disclosed. The method comprises generating a square wave form with a positive phase and a negative phase, sending the square wave form to a first circuit that is connected to a battery cell and to a second circuit with matching components of the first circuit, and finally driving a matching voltage of the second circuit to become equivalent to the battery cell voltage for measurement.

8 Claims, 8 Drawing Sheets

VOLTAGE MEASUREMENT FOR MULTIPLE CELL BATTERY PACK

CROSS REFERENCE TO RELATED APPLICATIONS

This application is filed pursuant to 37 C.F.R., 1.53(b) as a continuation-in-part of the commonly-assigned U.S. patent application Ser. No. 14/099,956 filed on Dec. 8, 2013, which claims the benefit under 35 U.S.C. § 119(e) of U.S. Provisional Application No. 61/737,048 filed on Dec. 13, 2012 and incorporated herein by reference.

This application is related by common inventorship and subject matter to the commonly-assigned patent application Ser. No. 14/099,957 filed on Dec. 8, 2013.

FIELD OF THE INVENTION

The present invention relates generally to battery charging and protection, and more particularly to voltage measurement for a plurality of rechargeable battery cells.

BACKGROUND OF THE INVENTION

Many battery powered products require the use of multiple cell battery packs with the cells connected in series to achieve a high enough voltage for proper operation. The rechargeable type of battery packs need to be recharged periodically so that the powered operation can continue. And, special care needs to be taken to avoid damage to the battery cells during charging and operation. Two typical damages to battery cells are overcharging and deep-discharging.

Overcharging may cause severe damages to battery cells, and may even become safety concerns. Overcharging lithium-ion or lithium polymer batteries, for example, may cause thermal runaway, and the high temperature developed may lead to cell rupture. Fire hazards have been reported during charging as extreme cases. Therefore, much attention has been paid to battery overcharging and solutions have been designed to avoid battery damage and safety issues. The typical charging system developed applies one charger to charge all cells connected in series in a battery pack. Since all cells are not manufactured the same, some cells may charge faster than others. As such, charging a battery pack with a single charger charging a plurality of cells can lead to overcharging some of the cells, U.S. Pat. No. 4,079,303, issued to Cox on Mar. 14, 1978, discloses a two step charging system to charge all battery cells connected in series at an initial charging rate to a predetermined voltage threshold, followed by an equalization procedure for charging each of the cells with controlled and equal voltage to fully charged state. The disadvantage of such a system is that the equalization phase is based on a conservative estimate of a predetermined charging voltage threshold. And the charging process can be time consuming when the battery pack contains many cells.

A common practice of using a single charger to charge a battery pack of a plurality of cells is to use a shunt circuit to bypass the charging circuit of each individual cell when it is fully charged to avoid overcharging and over heat. U.S. Pat. No. 6,388,424B1, issued to Hidaka et al on May 14, 2002, teaches a system for charging a plurality of lithium-ion battery cells connected in series. And, each of the cells has a shunt circuit connected in parallel with the cell. A comparator compares the charging voltage of each cell with a reference voltage. When the charging voltage is higher than the reference voltage, a switch is activated to direct the electricity to the shunt circuit for the cell. Although the invention is trying to supply the surplus energy to the next cell in line, this system inevitably causes energy waste for charging which is not friendly to the environment.

Another damage that can happen to battery cells is deep-discharging. And this is especially true for lithium-ion and lithium polymer batteries. When a charged battery pack of a plurality of cells is connected to a load, each cell is gradually discharged, and the cell voltage declines. When a cell is discharged below a defined low voltage threshold, further discharging may damage it. After that, the cell may have degraded storage capacity. For example, a certain lithium-ion battery cell of the LiFePO4 variety should not be discharged below 2.5 volts to avoid deep-discharging damage. It is important, therefore, that care is taken to remove the battery load before the low cell voltage limit is reached.

Therefore, it is important to manage individual cells in a battery pack to effectively avoid over charging or deep-discharging of the each cell. For a battery pack of a plurality of cells, each cell can behave differently due to variations of manufacturing and parts supply. It is apparently advantageous to measure the voltage of each of the cells due to the uncertainties. In this way, when the voltage of any one of the plurality of the cells reaches a predetermined low voltage limit, a decision is made to unload the battery pack. And the battery pack is effectively protected. It is also advantageous to individually manage the charge of each of the plurality of cells in a battery pack so that no one cell is overcharged.

Therefore, there is a need for a simple and inexpensive way to manage each cell in a battery pack containing a plurality of cells for the best battery protection and extended battery life.

SUMMARY OF THE INVENTION

It is therefore an object of the invention to provide a method and an apparatus to detect the voltage for each of a plurality of cells in a battery pack. It is also an object of the invention to provide a method and a system to manage a loaded battery pack including a plurality of rechargeable battery cells.

According to one aspect of the invention, the method of detecting a voltage of a rechargeable battery cell involves generating a waveform with a positive phase and a negative phase by a square wave generator. Then, sending the positive phase of the wave form to a first loop of a first circuit including a resistor, a capacitor and the battery cell. The positive phase of the wave form causes a current to flow from the generator through the resistor and the capacitor to the positive side of the battery cell. And, the negative phase of the wave form causes current to flow from the generator to a second loop including the resistor and capacitor in the first circuit. The negative wave form causes current to flow from the negative side of the battery cell toward the generator.

According to another aspect of the invention, the method of detecting a voltage of a rechargeable battery cell involves sending a waveform of a positive phase and a negative phase from the square wave generator to a second circuit including matching components for R1 and C1. The second circuit is similar to the first circuit connected to the battery cell but with the battery cell substituted by an integrator. The waveforms at the junction of the capacitor and the resistor for the first circuit and the second circuit are compared, and an integrator is driven to make them the same.

According to yet another aspect of the invention, the method of detecting a voltage of a rechargeable battery cell involves measuring the output from the integrator as the battery voltage.

According to yet another aspect of the invention, the current flow directions in the first electrical loop and in the second electrical loop is realized by diodes.

According to yet another aspect of the invention, the diodes in the measurement circuits are compensated for temperature changes during voltage detection.

BRIEF DESCRIPTION OF THE DRAWINGS

These and other objects and features of the invention will become more full apparent from the following description and appended claims taken in conjunction with the following drawings, where like reference numbers and alphanumeric names indicate identical or functionally similar elements.

DETAILED DESCRIPTION OF THE INVENTION

The present description will be directed in particular to elements forming part of or cooperating more directly with methods and apparatus in accordance with the present invention. It is to be understood that elements not specifically shown or described may take various forms well known to those skilled in the art.

Figure 1:
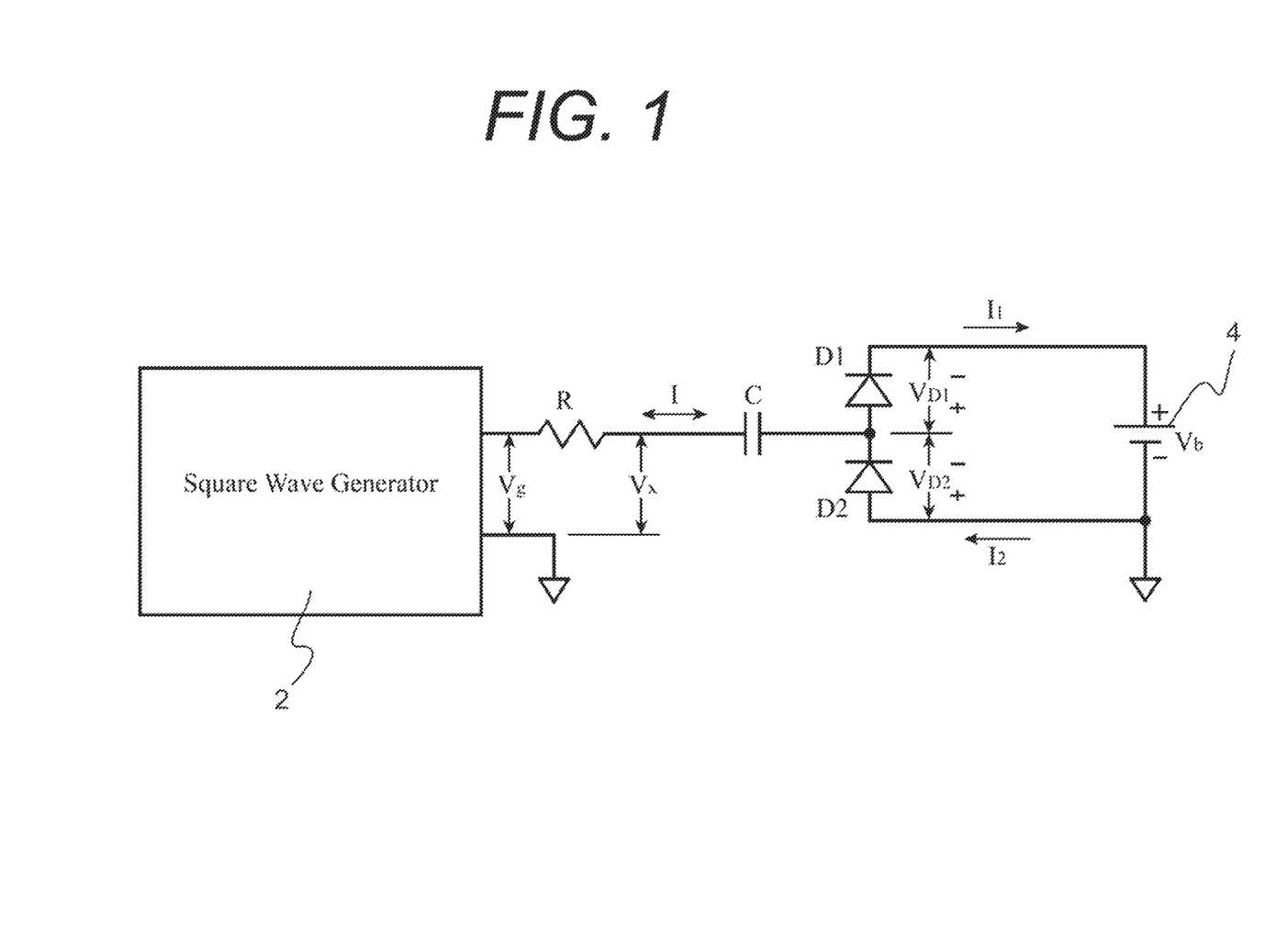
FIG. 1 is a schematic diagram of a first voltage detection circuit connected to a battery cell.

FIG. 1 shows a first circuit to detect the voltage of a battery cell. A square wave generator 2 is connected to a battery cell 4 with voltage $V_b$. And, square wave generator 2 and battery cell 4 are referenced to a common ground. Square wave generator 2 produces voltage waveform $V_g$ that has a series of waves with frequency F. Each wave has a positive phase and a negative phase, or a positive half cycle and a negative half cycle. The wave's peak-to-peak voltage amplitude, $V_{g\text{-}pp}$, is chosen to be large enough to be able to cause electrical current to flow toward the cell during the positive phase and away from the cell during the negative phase. The first circuit in FIG. 1 includes a resistor R1, a capacitor C1 and two diodes D1 and D2 that separate the circuit to two current loops depending on the phase of wave form $V_g$ from square wave generator 2. During the positive phase, square wave generator 2 sends out electrical current $I=I_1$ which travels in a first loop, in the direction from the generator, through resistor R1 and to capacitor C1, and then through diode D1 to the positive side of battery cell 4. When a negative phase is sent, electrical current $I=I_2$ travels in a second loop in the direction from the negative side of battery cell 4 through diode D2 to capacitor C1 and through resistor R1 back to the generator. Diodes D1 and D2 can be replaced with other types of rectifiers that allow one way current flow.

Figure 2:
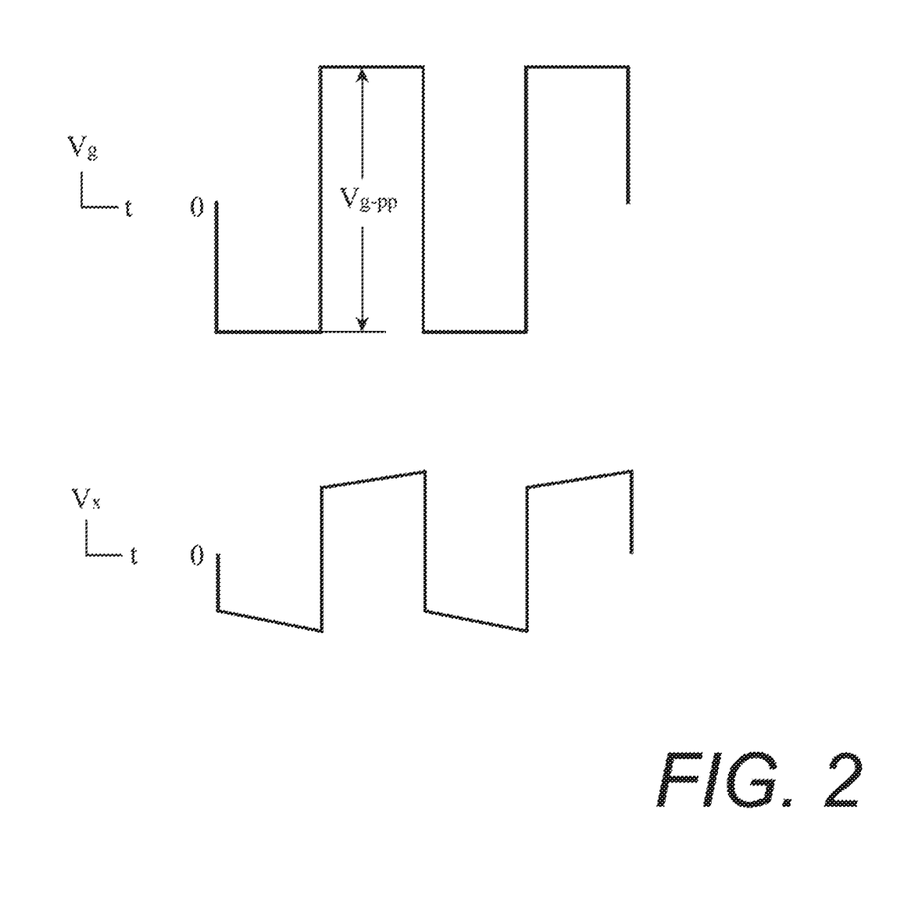
FIG. 2 is a chart showing electrical signals changing with time when applying the circuit in FIG. 1 for voltage detection.

Voltage measurement of $V_b$ involves the use of voltage $V_x$ which occurs at the junction of R1 and C1. In FIG. 2, waveforms of $V_g$ and $V_x$ are shown together with respect to time. It can be seen that during a positive phase of $V_g$, $V_x$ first has a sharp rising edge, followed by a gradual increase for the duration of the half cycle. Correspondingly during the negative phase of $V_g$, $V_x$ first has a sharp falling edge, followed by gradual decrease during the duration of the half cycle.

Figure 3:
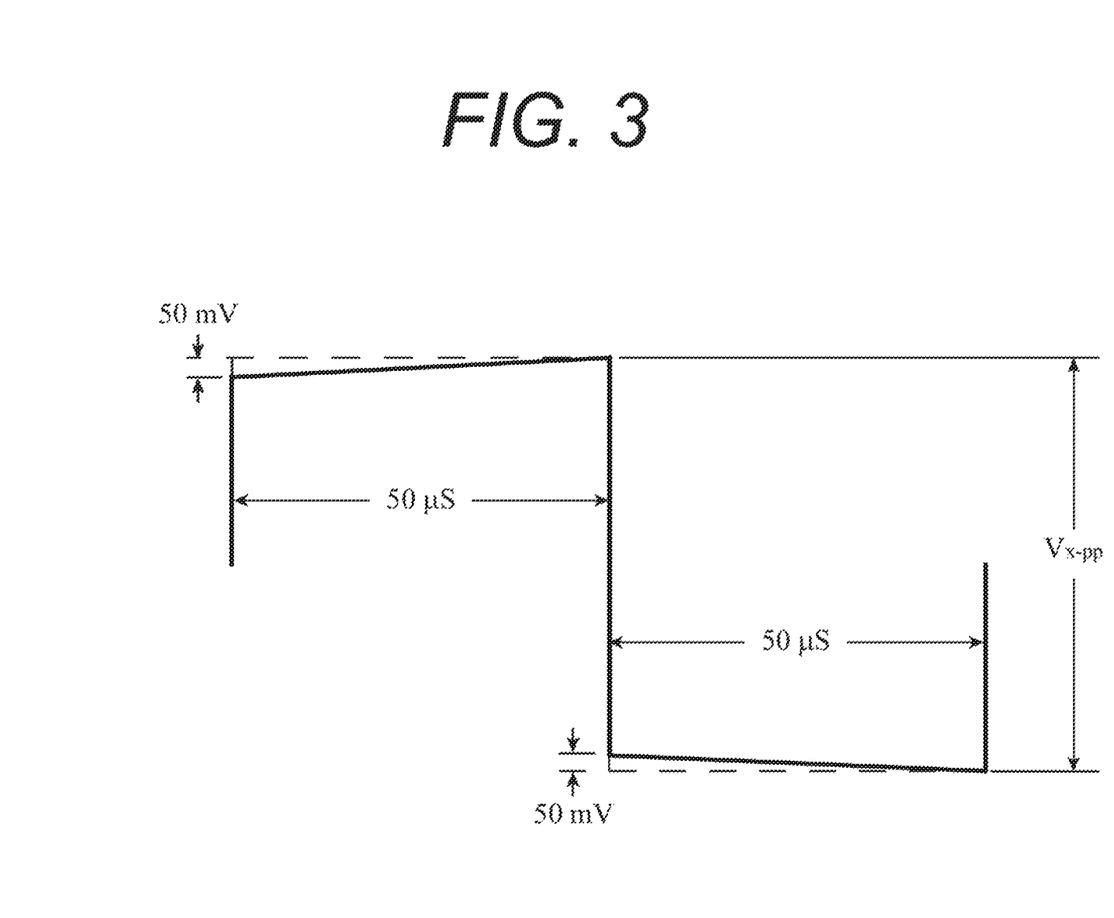
FIG. 3 shows a waveform of $V_x$ in FIG. 2 for one full cycle, including the positive half cycle and the negative half cycle.

In FIG. 3 the amplitude of $V_x$ is described in more details. As an exemplified embodiment, it is assumed that the square wave voltage is high enough so that current is essentially constant. So we set $I_1=I_2=1$ mA at 25° C., capacitor C1 having capacitance of 1.00 μF, and diode D1 and diode D2 having $V_{D1}=V_{D2}=0.575$ V. Waveform $V_g$ is set to have frequency F=10 KHz. Since current I is constant on each of the positive and negative half cycles, the slope of the voltage ramp in FIG. 3 can be calculated as $I/C = 1\times10^{-3}/1\times10^{-6} = 10^3$ V/S.

Because the time for each half cycle is $\frac{1}{2}F = \frac{1}{2}(10^4)^{-1} = 50\times10^{-6}$ S, the voltage change on the half cycle ramp is $(10^3$ V/S$) \times (50\times10^{-6}$ S$) = 50$ mV.

As such, $V_x$ should be equal to the summation of cell voltage $V_b$ plus the voltage drops at diodes D1 and D2 and 50 mV. In other words, $V_x$ is larger than the summation of cell voltage $V_b$ plus the voltage drop at diode D1 by 25 mV at the positive phase of wave form $V_g$, and 25 mV below the summation of cell voltage $V_b$ plus the voltage drop at diode D2 at the negative phase. This happens because capacitor C acquires whatever nominal charge necessary to make the positive and negative charge excursions equal. The capacitor therefore makes a +25 mV to −25 mV transition from its nominal charge on the first ramp, and the opposite on the second, so that each ramp traverses 50 mV. Therefore, the equation for the peak to peak value of $V_x$ can be written as:

$V_{x\text{-}pp} = V_{D1} + V_b + V_{D2} + 50$ mV

That is $V_{x\text{-}pp} = V_b + 0.575 + 0.575 + 0.05 = V_b + 1.2$ V

Therefore $V_b = V_{x\text{-}pp} - 1.2$ V

This means that cell voltage $V_b$ can be determined by calculation from the knowledge of $V_x$ if the capacitor ramp voltage and the diode voltages are known.

Figure 4:
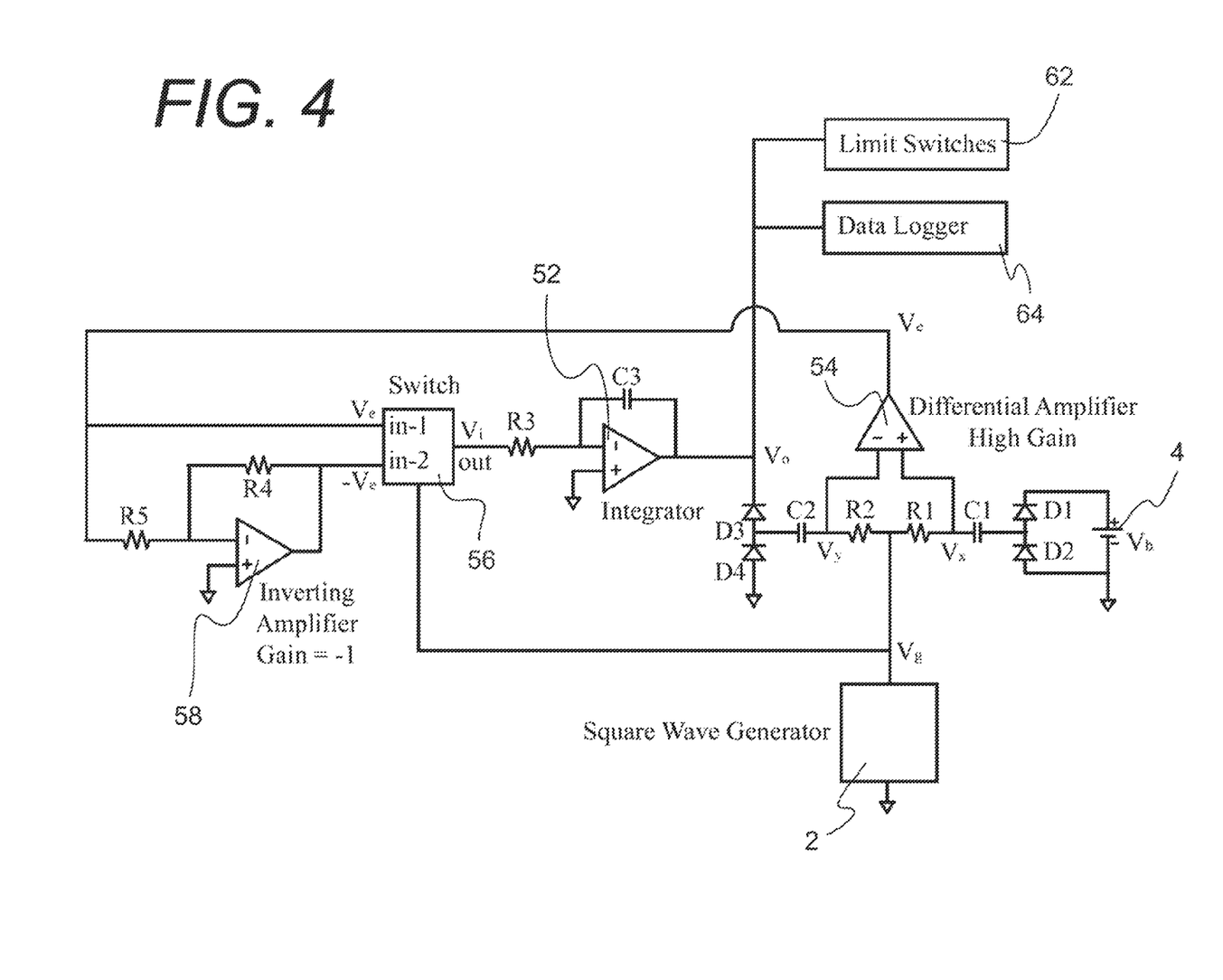
FIG. 4 is a schematic diagram of a voltage detection circuit connected to one cell, including the first circuit in FIG. 1 and a second circuit that matches the first circuit.

FIG. 4 shows a circuit that includes the first circuit in FIG. 1 represented as $V_b$, $V_g$, D1, D2, C1, R1 and square wave generator 2. In addition the circuit introduces a second circuit with matching elements to the first circuit: D3 and D4 are to match with D1 and D2, respectively; C2 to match with C1; and R2 to match with R1. Also integrator 52 with an, output matching voltage $V_0$ is included in the circuit. It can be seen that the output voltage $V_g$ from square wave generator 2 is applied to R1 in the first circuit, and produces a waveform $V_y$ at the junction of R1 and C1, as in the case shown in FIG. 3. However, generator 2 is also connected to R2 in the second circuit, which produces a waveform $V_y$ at the junction of R2 and C2. If matching voltage $V_o$ is the same voltage as $V_b$, the signal at $V_y$ is identical to the signal at $V_x$ because the same generator voltage is driving both sets of identical components in the first circuit and the second circuit. The remainder of the circuit in FIG. 4, besides the first circuit and the second circuit, functions to cause matching voltage $V_o$ to be equal to $V_b$. When equality is achieved, $V_o$ becomes the measurement output. The diode voltages and capacitor ramp in the first circuit of FIG. 4 are then compensated for by having identical voltages at $V_y$ as at $V_x$.

Figure 5:
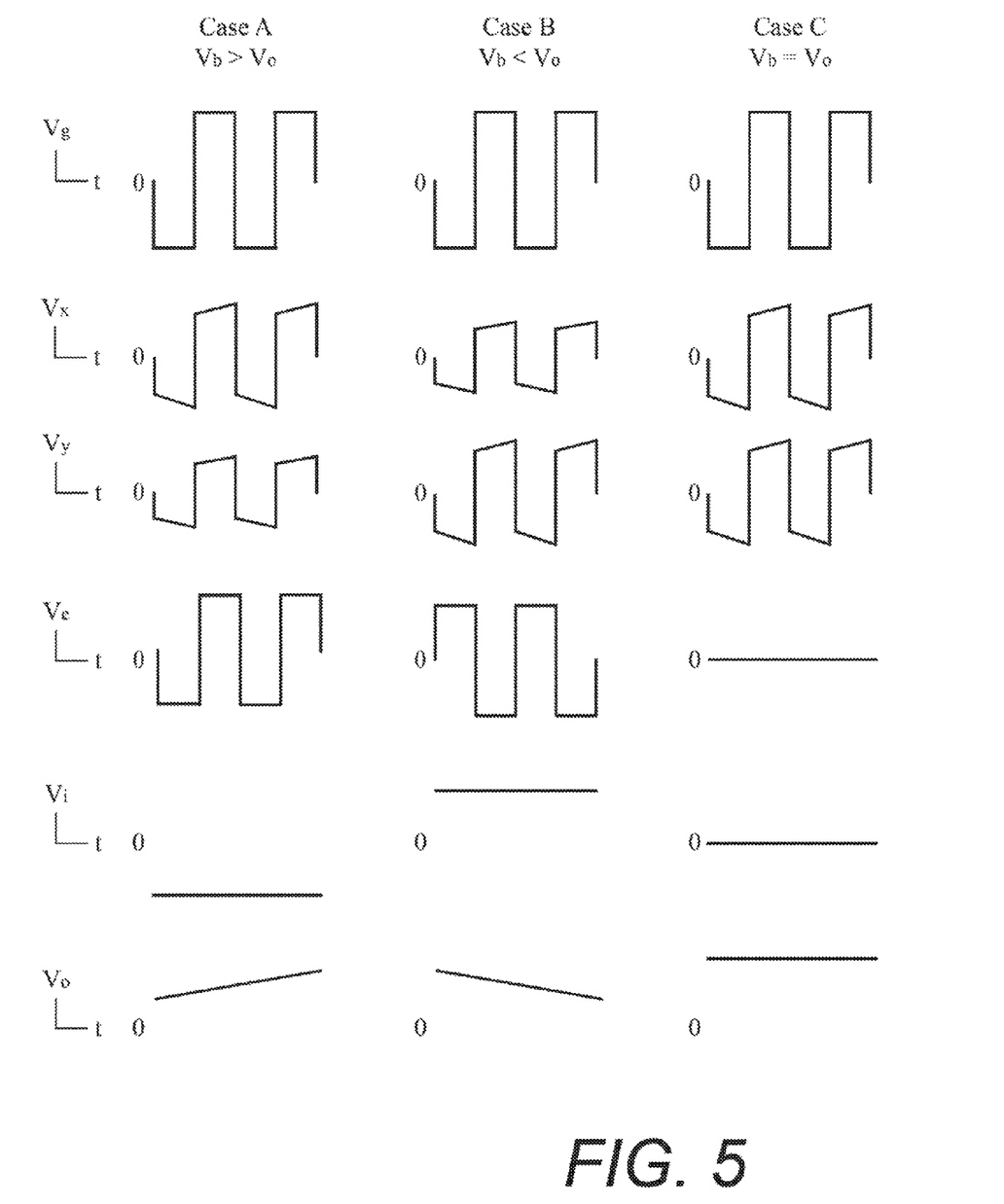
FIG. 5 is a chart of 3 cases showing electrical signals changing with time when applying the circuit in FIG. 4 for voltage detection.

FIG. 5 shows the waveforms of the voltages at different locations in FIG. 4 under 3 cases. Case A is when matching voltage $V_o$ is less than $V_b$. Case B is when $V_o$ is greater than $V_b$. And Case C is when $V_o$ is equal to $V_b$. In each case, the voltage output $V_g$ from generator 2 is the same. In case A, it can be seen that the amplitude of $V_x$ is larger than that of $V_y$. The reason for this is because $V_o$ is lower than $V_b$. Both $V_x$ and $V_y$ are fed to differential amplifier 54 in FIG. 4 resulting in output $V_e$ which is driven to positive and negative saturation by its high gain. $V_e$ is then fed to switch 56 and inverting (gain=−1) amplifier 58. The output of inverting amplifier 58 is also fed to switch 56 as $-V_e$. The output of switch 56 is controlled by the generator voltage $V_g$ such that when $V_g$ is in its negative phase it controls switch 56 to output $V_e$, and when $V_g$ in its positive phase switch 56 outputs $-V_e$. So for Case A. $V_g$ in negative phase causes the negative $V_e$ to be fed to switch 56, producing negative $V_i$. And, $V_g$ in positive phase of causes $-V_e$ to be fed to switch 56, also producing negative $V_i$. Therefore, output $V_i$ from switch 56 stays negative for both positive and negative phases of $V_g$. This constant negative value of $V_i$ drives output $V_o$ from integrator 52 to move in the positive direction toward $V_b$.

In Case B, for the same explanations delineated above the opposite occurs where $V_o$ is driven downward toward $V_b$.

Finally in Case C when $V_o = V_b$, $V_e$ and $V_i$ are both zero and integrator 52 holds its output voltage $V_o$ constant. Thus voltage $V_o$ is moved to become equal with $V_b$ regardless if it begins too high or too low. In summary, a feedback loop is formed: the error of $V_y$ as gauged by $V_x$, is fed back to the circuit consisting of amplifiers and integrator to correct matching voltage $V_o$ driving the value of $V_y$ to equal to $V_x$. Since the second circuit has identical components as in the first circuit. Consequently, the feedback ensures that $V_o = V_b$ is achieved.

$V_o$ is connected to a limit switch circuit 62 and a data logger circuit 64. When enough time has elapsed the circuit settled, the same of $V_o$ becomes a correct representation of $V_b$. Then $V_o$ can be logged by data logger 64, and can be compared with limits by limit switches 62. Limit switches 62 may function to cut off the battery load from cell 4 if the cell voltage $V_b$ becomes too low or stop charging during a charging cycle when cell voltage $V_b$ becomes too high. The battery cell voltage measurement data store in data logger 64 can serve the purposes of quality management and batter life tracking.

Figure 6:
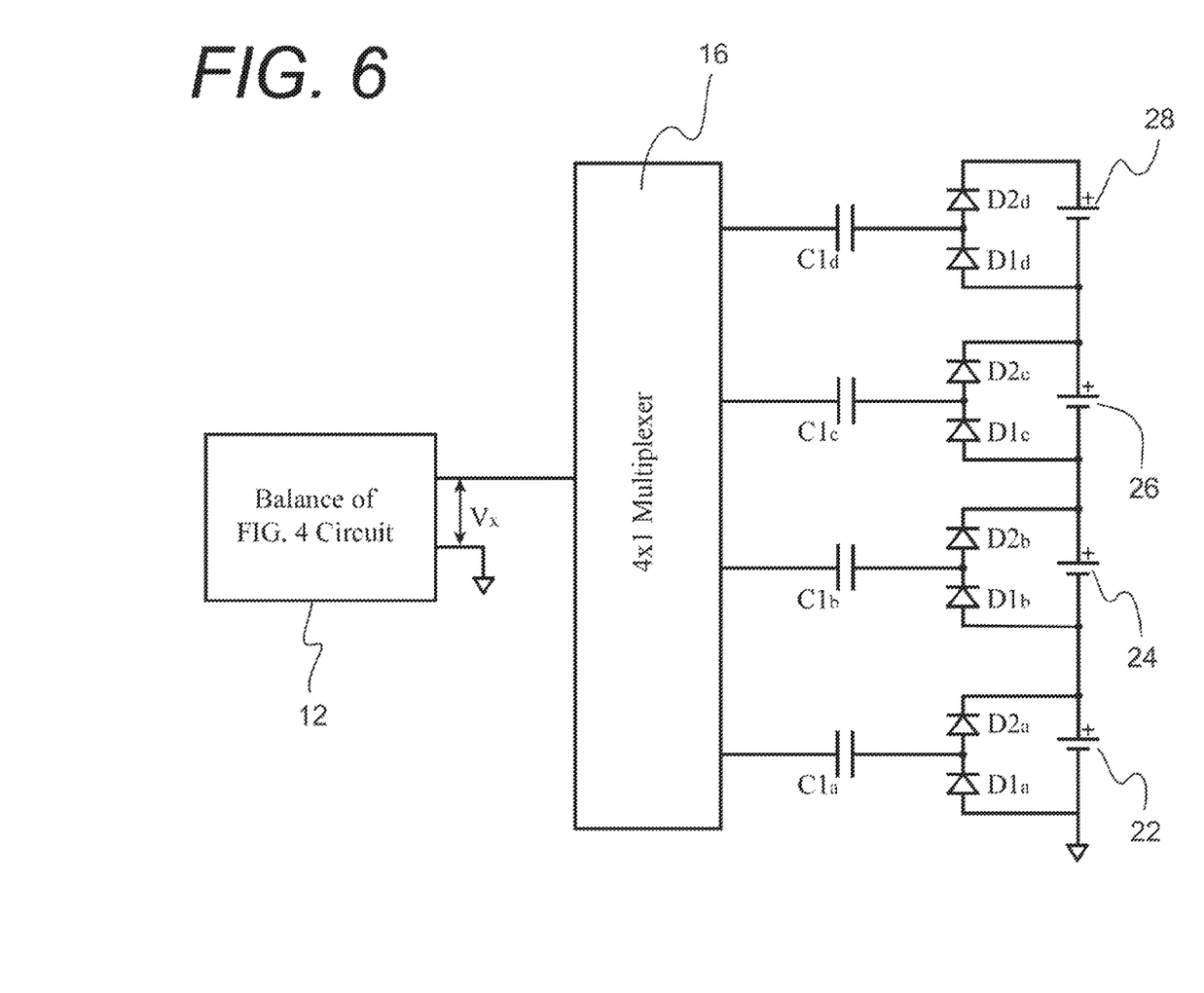
FIG. 6 is a schematic diagram of voltage detection circuit for 4 battery cells connected in series, based on the circuit in FIG. 4.

Turning to FIG. 6, the voltage detection circuit of FIG. 4 is applied to detect voltages of 4 cells in a battery pack. A portion of the first circuit in FIG. 1 consisting of C1, D1, and D2 are replicated for each cell, and are labeled with subscripts a, b, c, and d associated with the different cells. Because the circuit for each cell is identical, the practice can be expanded to detect voltages of many cells in as battery pack, whether the cells are connected in series or in parallel. In practice, the limit to the number of cells in a battery pack is determined by the voltage and current required for the operation, in addition to cost considerations. In FIG. 6, balance of FIG. 4 circuit 12 includes those the second circuit and other components in FIG. 4 that are not already shown in FIG. 6. Balance of FIG. 4 circuit 12 is shared by 4 first circuits for the battery cells 22, 24, 26 and 28. Each first circuit is connected to one battery cell at one end and to a common analog signal multiplexer 16 at the other end. Multiplexer 16 can include control logics or a processor that is able to manage multiple tasks. The wave signal $V_x$ from circuit 12 is manipulated by multiplexer 16 and sent to cells 22, 24, 26 and 28 sequentially. Each of the 4 first circuits for voltage detection of individual cells 22, 24, 26 and 28 are identical to each other. That is, capacitors $C1_a$, $C1_b$, $C1_c$ and $C1_d$ are identical. And diodes $D1_a$ and $D2_a$ are identical to $D1_b$ and $D2_b$, to $D1_c$ and $D2_c$, and to $D1_d$ and $D2_d$.

Figure 7:
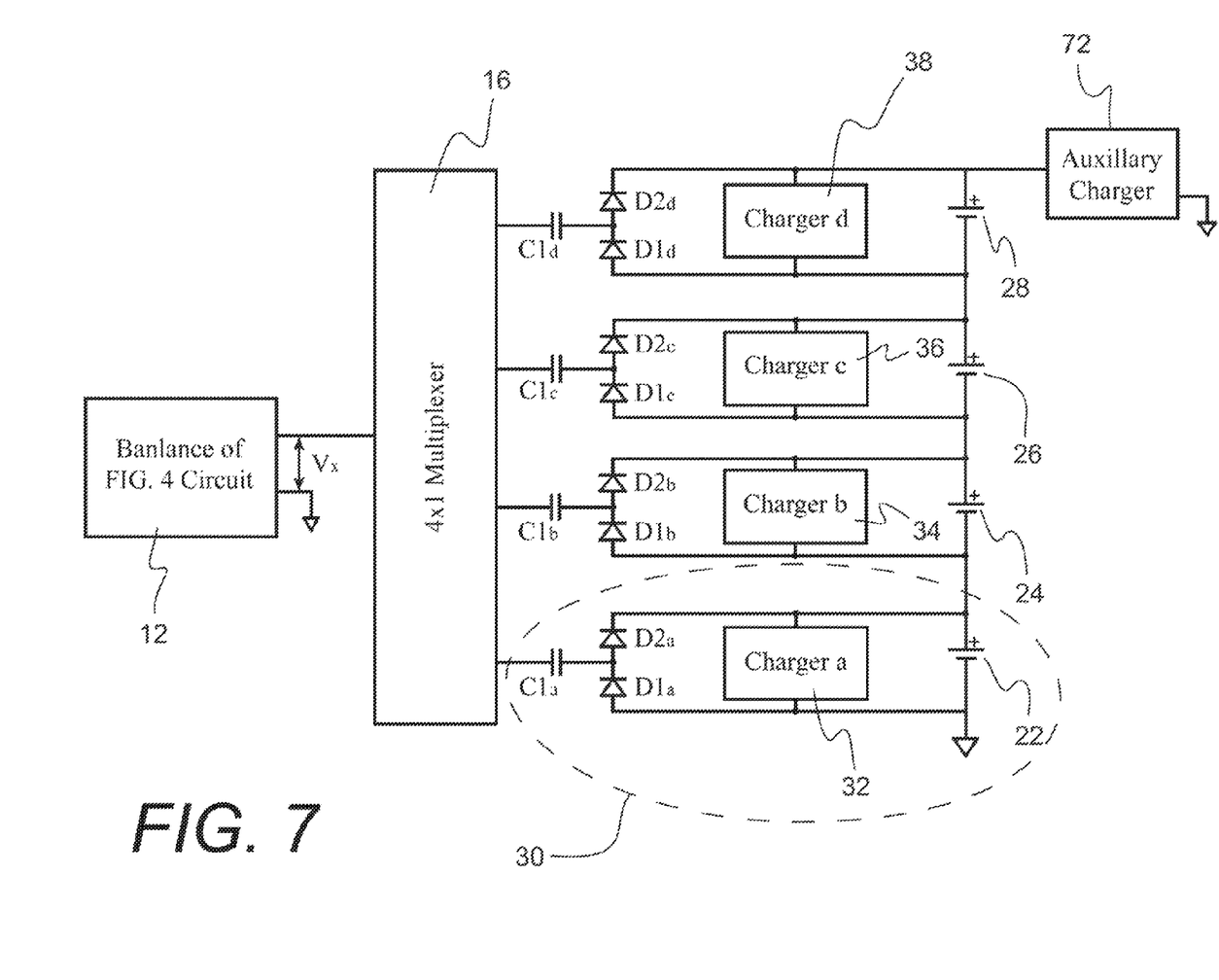
FIG. 7 is a schematic diagram of a voltage detection and charging circuit for 4 battery cells connected in series, based on the circuit in FIG. 4.

Now turning to FIG. 7, as portion of the voltage detection circuit in FIG. 4 is coupled with a plurality of battery chargers. Four battery chargers 32, 34, 36 and 38 are used to charge battery cells 22, 24, 26 and 28, respectively. In addition, auxiliary charger 72 is shown connected to the cells. Auxiliary charger 72 may be a solar charger or a "quick charge" unit. In this case, the voltage detection circuit in FIG. 4 works with limit switch 62 to monitor cell voltage and to prevent over charging during a charging event. FIG. 7 shows that each of the battery chargers 32, 34, 36, and 38 has 2 wires to connect to its respective cell. But common wire sharing by adjacent chargers is possible. Chargers 32, 34, 36, or 38 can be a type of lithium-ion or lithium polymer battery charging device that is commercial available. Lithium-ion and lithium polymer batteries have high voltage limit above which damage to battery cell can happen. As such, battery chargers 32, 34, 36 and 38 preferably include their own circuits for detecting the battery charging state, manipulating charging rate when charging voltage approaches the high voltage limit, and ending charging when the high voltage limit is reached. Comparing with the voltage detection circuit of FIG. 4, the detection circuit included in a battery charger may have the advantage of manipulating and controlling the behavior of the charger.

The capacitors and the diodes of each detection first circuit in FIG. 7 can be located next to their coupled charger. For example, capacitor $C1_a$, diodes $D1_a$ and $D2_a$, and charger 32 can be placed in close vicinity or packaged together in the same housing. Further the detection and charging components can be placed close to battery cell 22. The voltage detection components and battery chargers of FIG. 7 can take other arrangements as optimal to battery pack integration.

Since the detection circuit and cell charger for each of the battery cells in FIG. 7 are simple and identical, it is possible to design and package them as a module. Such an embodiment is further depicted in FIG. 8, which is taken out of FIG. 7 as module 30 for cell 22. Module 30 contains voltage detection first circuit including components $C1_a$, $D1_a$ and $D2_a$, and charger 32. Preferably, these components are standard components available on the market. They can be packaged closely together. For example, they can be assembled in a small housing on a mass production assembly line as an intermediate product. Though module 30 is taken out of FIG. 7 as connected to cell 22, it can be connected to any of the 4 cells because all the detection and charging modules are identical. During battery pack integration, the number of modules 30 are selected to match the number of battery cells in the battery pack. Then each module 30 is connected to a different battery cell. Since modules 30 are modularized and wiring is simple, no attention needs to be paid to match module and cell. As such, the integration or assembly process is simple and can be error free. During operation when one module experiences an issue, it can be replaced without touching other modules in the same battery pack. Therefore, a modular device for voltage detection and battery charging, such as module 30 of FIG. 8, significantly reduces the complexity and greatly simplifies the integration and maintenance.

Module 30 can be further simplified by shared wiring of voltage detection and charging. For many applications; charging and discharging of a battery pack do not need to take place simultaneously. For example, for a certain type battery powered vehicle, battery charging happens when the vehicle is stopped and connected to a charging station. At the time, it is proper to temporarily remove the load from the battery. And, with the exception of monitoring, individual cells when charging from an auxiliary charger, the need for voltage detection is during battery in operation. This is especially true when battery chargers, such as many commercially available types, have the capability to detect battery voltage and control the charging process. In this case charger 32 in FIGS. 7 and 8 includes a voltage detection circuit that senses the voltage of battery cell 22 and controls charger 32 during a charging event accordingly. As such, module 30 in FIGS. 7 and 8 only has two wires connecting to the cell, one wire to the positive side of the cell and the other to the negative side. And, the same wiring used for cell voltage detection by the detection circuit that includes capacitor $C1_a$ and diodes $D1_a$ and $D2_a$ is also used for charging: voltage detection happens during battery in operation; and charging happens when battery voltage is low and is not in operation. It can also be seen in FIG. 7 that only 1 wire connects module 30 to shared multiplexer 16 because the circuit return to common is accomplished through the battery pack.

Figure 8:
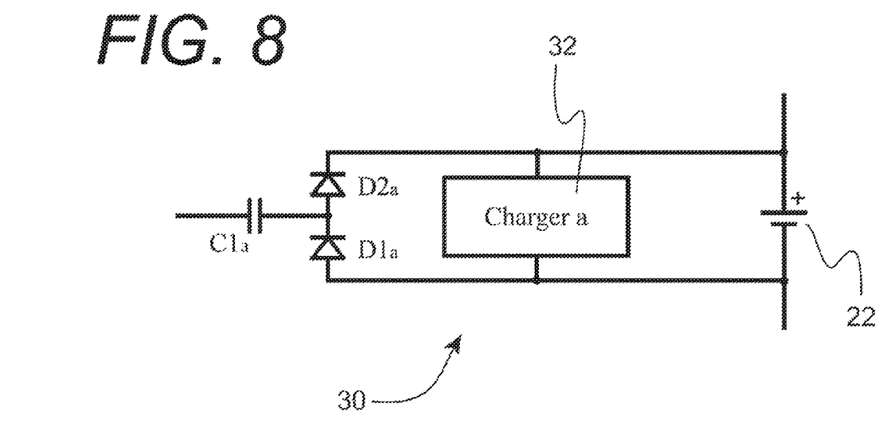
FIG. 8 is schematic diagram of the voltage detection and charging module for a battery cell taking out of FIG. 7.
Figure 9:
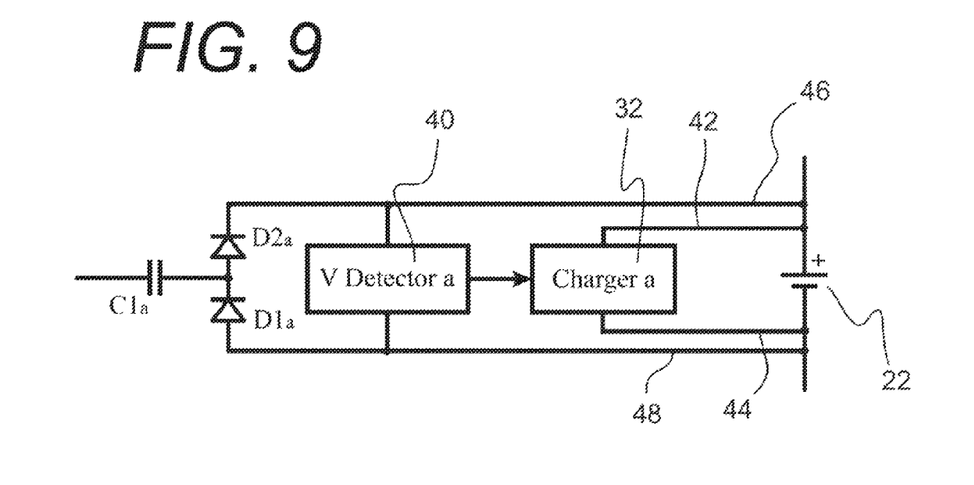
FIG. 9 is an alternative schematic diagram of FIG. 8 including additional wires between the battery cell and the voltage detection and charging module.

An alternative of Module 30 of FIG. 8 is shown in FIG. 9 to have extra wiring and to include a secondary voltage detection circuit 40. Charger 32 is connected to battery cell 22 through wires 42 and 44. And the secondary voltage detection circuit 40 shares the same wiring 46 and 48 with the main detection circuit that includes capacitor $C1_a$ and diodes $D1_a$ and $D2_a$ to connect to battery cell 22. In this way voltage detection by the main voltage detection circuit as illustrated in FIG. 7 or by the secondary voltage detection circuit 40 can detect the voltage of the batter cells 22, 24, 26 and 28 when the cells are being charged without being affected by the voltage drop caused by the charging current. Therefore, the circuit of FIG. 9 can be applied to the cases where cell charging and voltage detection need to happen simultaneously. In FIG. 9, V Detector 40 represents an example that a voltage detection circuit is included in a commercially available battery charging system that includes charger 32.

Back to FIG. 7, the components that are shared by the voltage detection and cell charging modules, include multiplexer 16, and balance of FIG. 4 circuits 12, can be packaged together. For example, they can be assembled on a single PCB. Then, the PCB can be placed close to the detection and charging modules, thereby assuring isothermal conditions for accurate temperature compensation.

The number of cells connected together in a battery pack, and measured with the method of this invention is only limited by the voltage ratings of the capacitors used and the required sampling time and frequency, making this technique very powerful. In addition, the low cost of the components associated with each cell allows for economical use with a many cell pack.

It is understood that the above-described invention is merely illustrative of the possible specific embodiments which may represent principles of the present invention. Other arrangements may readily be devised in accordance with these principles by those skilled in the art without departing from the scope and spirit of the invention.

The invention claimed is:

1. A method for detecting a voltage of a rechargeable battery set in an apparatus, the apparatus including a square wave generator, a first circuit that has a resistor, a capacitor and the rechargeable battery set, and a second circuit that has a resistor and a capacitor matching the equivalent, components in the first circuit, the method comprising the steps of:
    generating a wave form with a positive phase and a negative phase by the square wave generator;
    sending the wave form to the first circuit, wherein the positive phase of the wave form flows a first loop from the resistor to the capacitor and to the positive side of the rechargeable battery set, and the negative phase of the wave form flows a second loop from the negative side of the battery set toward the capacitor and then the resistor;
    sending the wave form to the second circuit;
    driving a matching voltage in the second circuit to become equivalent to the voltage of the rechargeable battery set; and
    measuring the matching voltage as the battery voltage.

2. A method for detecting voltages of a battery pack having a plurality of rechargeable battery sets in an apparatus, the apparatus including a square wave generator, a first circuit that has a resistor, a multiplexer, and the plurality of rechargeable battery sets each connected to the multiplexer with an identical capacitor between the battery set and the multiplexer, a second circuit that has a resistor and a capacitor matching the equivalent components in the first circuit, the method comprising the steps of:
    sequentially connecting the square wave generator to each of the plurality of battery sets with the multiplexer; and
    performing the steps as recited in claim 1 for each of the plurality of rechargeable battery sets.

3. The method as recited in claim 2 wherein:
    driving the matching voltage in the second circuit to become equivalent to the voltage of the rechargeable battery set is done through a feedback loop.

4. The method as recited in claim 2, further comprising:
    storing the voltage measurement data in a data logger.

5. The method as recited in claim 2, wherein:
    each of the plurality of rechargeable battery sets in the first circuit is further connected to an identical pair of a first diode and a second diode that are connected in parallel between the battery set and the capacitor, and the second circuit further includes a pair of a third diode and a forth diode, wherein the third diode and the fourth diode match the first diode and the second diode of the first circuit respectively; and
    wherein when sending the wave form to the first circuit for each of the plurality of rechargeable battery sets, flow direction of the positive phase of the wave form in the first loop is determined by the first diode, and flow direction of the negative phase of the wave form in the second loop is determined by the second diode.

6. The method as recited in claim 1 wherein:
    driving the matching voltage in the second circuit to become equivalent to the voltage of the rechargeable battery set is done through a feedback loop.

7. The method as recited in claim 1, further comprising:
    storing the voltage measurement data in a data logger.

8. The method as recited in claim 1, wherein:
the first circuit further includes a first diode and a second diode, and the second circuit further includes a third, diode and a forth diode, wherein the third diode and the fourth diode match the first diode and the second diode of the first circuit respectively; and
wherein flow direction of the positive phase of the wave form in the first loop is determined by the first diode, and flow direction of the negative phase of the wave form in the second loop is determined by the second diode.

\* \* \* \* \*